United States Patent [19]

Dockendorf et al.

[11] 3,877,059

[45] Apr. 8, 1975

[54] SINGLE DIFFUSED MONOLITHIC DARLINGTON CIRCUIT AND METHOD OF MANUFACTURE THEREOF

[75] Inventors: Carl Edwin Dockendorf, Tempe; Frank Joseph Reznick, Phoenix, both of Ariz.

[73] Assignee: Motorola, Inc., Franklin Park, Ill.

[22] Filed: Sept. 30, 1974

[21] Appl. No.: 510,203

Related U.S. Application Data

[63] Continuation of Ser. No. 320,387, Jan. 2, 1973, abandoned.

[52] U.S. Cl. .......................... 357/46; 357/40; 357/56
[51] Int. Cl. .......................... H01l 19/00
[58] Field of Search ........... 357/40, 46, 56; 307/315

[56] References Cited

UNITED STATES PATENTS 3,624,454 11/1971 Adkinson et al. .................... 357/46

*Primary Examiner*—Michael J. Lynch
*Assistant Examiner*—E. Wojciechowicz
*Attorney, Agent, or Firm*—Vincent J. Rauner; Charles R. Hoffman

[57] ABSTRACT

A single-diffused structure for a monolithic Darlington transistor circuit and method for fabricating same. Mesa type emitter regions for the input and output transistors and a common collector region are simultaneously deeply diffused into a semiconductor wafer which forms a common base layer. The input transistor for each Darlington circuit includes a rectangular emitter mesa region, having an aperture therein to allow contact to the base layer, is located in a corner of each die and extends to the edge of the die. The resistance parallel to the emitter-base junction of the input transistor includes the distributed resistance of the material in the base layer extending from the base contact area within the emitter aperture beneath the surrounding emitter mesa region to an area contacted by an emitter-base shorting metal layer at the periphery of the input emitter mesa. During the fabrication of monolithic Darlington circuits on a silicon wafer a single mesa region forms the apertured emitters of an array of four Darlington circuits, each rotated 90° with respect to the adjacent ones, prior to the scribing and die separation operations, whereby the single mesa region extends across the scribe grid areas separating the circuits. After the metal pattern is applied the semiconductor wafer is laser scribed and the monlithic dice are separated.

7 Claims, 9 Drawing Figures

SINGLE DIFFUSED MONOLITHIC DARLINGTON CIRCUIT AND METHOD OF MANUFACTURE THEREOF

BACKGROUND OF THE INVENTION

This is a continuation of application Ser. No. 320,387 filed Jan. 2, 1973 Now Abandoned

FIELD OF THE INVENTION

This invention relates to a monolithic two-transistor Darlington circuit manufactured in a single diffusion step, and more particularly to such a device having mesa-type emitter structures.

DESCRIPTION OF THE PRIOR ART

It is known that single-diffused mesa type power transistors have certain advantages over high frequency epitaxial base power transistors for certain applications. Single-diffused mesa type transistors are fabricated by diffusing collector and emitter regions simultaneously into lightly doped P-type material with the base being formed by the undiffused portion of the P-type material. The emitter and collector junctions are therefore equidistant from opposite surfaces of the semiconduction chip. Deep junction depths are normally provided in order to bias off high-current density areas of the emitter-base junction, thereby leading to uniform current distribution along the entire emitter-base junction area. The result is that single-diffused misa type power transistors have very good safe operating area (SOA) characteristics, but have low frequency response due to the relatively high distributed resistance, resulting in large magnitude RC time constants. The high distributed resistance is primarily a result of the high resistivity of the starting material (the lightly doped P-type material). Epitaxial base power transistors are manufactured by diffusing the emitter into an epitaxial base region deposited on a collector substrate. The epitaxial base region is normally lower in resistivity than the base layer for single-diffused devices, and the final base width is much less for epitaxial base transistors than for single-diffused mesa type transistors. Epitaxial base transistors therefore have higher high current gain and higher frequency response than single-diffused mesa type transistors, but have a greater tendency to go into secondary breakdown, which frequently results in device failure. If both single-diffused Darlington circuits and epitaxial base Darlington circuits were available, the same advantages and trade-offs between the two would exist as for discrete transistors. However, until the present invention it has been impractical in the semiconductor industry to produce single-diffused monolithic Darlington circuits, the main reason being that diamond scribing techniques are impractical because it is necessary to locate part of the emitter mesa close to or across the scribe grid (for reasons described hereinafter), and the diamond scribe can not be drawn across a mesa step. However, new laser scribing techniques and abrasive sawing techniques have made fabricating of such devices feasible. In summary, the monolithic Darlington circuits in the prior art are not suitable for operation at high collector voltages near the collector-emitter breakdown voltage of the device, because they are prone to secondary breakdown and device failure in that region. The present invention solves these problems by providing a single-diffused mesa type monolithic Darlington circuit having excellent SOA characteristics and a method for manufacturing same.

SUMMARY OF THE INVENTION

It is another object of this invention to provide a single-diffused mesa type power Darlington circuit.

It is an object of this invention to provide a monolithic power Darlington circuit having high safe operating area.

It is a further object of this invention to provide a monolithic power Darlington circuit of the type described wherein the mesa type emitters of the input transistor extend to the edge of the monolithic die.

It is yet another object of this invention to provide a single-diffused mesa type monolithic Darlington circuit of the type described wherein the devices are manufactured so that prior to scribing and separation a single mesa type region includes the emitters of the input transistors for a multi-chip array.

It is yet a further object of this invention to provide a monolithic single-diffused mesa type power Darlington circuit of the type described wherein the monolithic dice are scribed by laser scribing or by abrasive sawing.

Briefly described, the invention provides the structure and method for making a single-diffused mesa type monolithic power Darlington device. The construction is such that adjacent emitter geometries for the input transistors are provided in groups in a semiconductor wafer prior to the scribing and separation operations. The emitter-base resistor for the input transistor achieves a suitably high value by virtue of the extension of the emitter mesa of the input transistor to the edge of the die. Separate N+ mesa type emitter regions for both the input and the output transistors are provided on a single P-type body of silicon which provides the base regions for both transistors. A single N+ region on the opposite surface of the body of semiconductor provides the collector region for both transistors. The mesa-type emitter region for each input transistor has a rectangular aperture therein, exposing an area of P-type base material which is metallized to provide electrical contact to the base of the input transistor. The mesa-type emitter region for each input transistor is located in a corner of the rectangular die and extends to the edge of two sides thereof, and, prior to the die scribing and separation operations, connects to the corresponding symmetrically placed mesa-type emitter regions of each of the adjacent dice. Thus, it is seen that in accordance with the invention the Darlington devices are produced in arrays of four symmetrically placed dice, each array having a single continuous mesa type region forming therein the four emitter regions for the four adjacent dice. The continuous mesa type region extends across the scribe grid regions between the four dice. The base-emitter resistor of the output transistor is formed by a region of the P-type base layer which lies between two metal layers on the surface of the die. The first metal layer contacts the common base layer, maintaining the entire base layer at a uniform potential at regions adjacent to the emitter mesa regions. The first metal layer also overlies the emitter region of the input transistor thereby maintaining the surface thereof at a uniform potential. The second metal layer contacts the surface of the emitter mesa region of the output transistor to maintain uniform potential thereof, and to allow electrical connection thereto by an external electrode. The second metal layer contacts an area of the base layer to provide one terminal of the base emitter resistor of the output transistor, the resistance of which is determined by the spacing between the first and second metal layers, the width of the area at which the second metal layer contacts the base layer, and the surface resistivity of the base layer. The base emitter resistor of the input transistor extends from the base metal contact area of the input transistor within the aperture of the emitter mesa beneath the mesa region to an area of the base layer contacted by the previously described first metal layer. This resistance is therefore increased due to the extensions of the emitter mesa region to the edge of the die. The entire wafer is laser scribed and separated after the metal pattern is applied.

DESCRIPTION OF THE INVENTION

Figure 1:
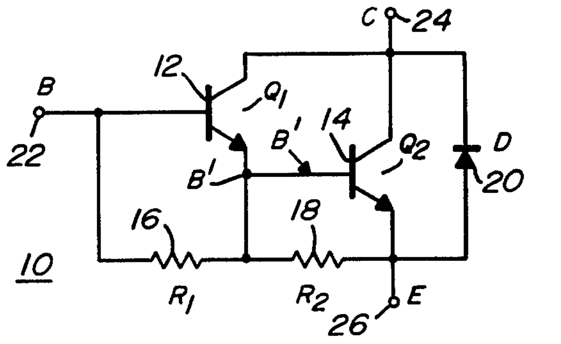
FIG. 1 shows an electric circuit diagram of a Darlington transistor circuit.

FIG. 1 is a schematic diagram of a Darlington transistor circuit 10. The input transistor 12, designated Q1, has its emitter connected to the base of the output transistor 14, designated Q2. A first resistor 16, designated R1, is connected between the base and emitter of input transistor Q1, and a second emitter of output transistor Q2. A diode 20 has its anode connected to the emitter of Q2 and its cathode connected to the collector of Q2. Darlington circuit 10 has three external electrodes, including input electrode 22 connected to the base of input transistor 12, and a collector electrode 24 connected to the collectors of both input transistor 12 and output transistor 14, and an emitter electrode connected to the emitter of output transistor 14.

Figure 2:
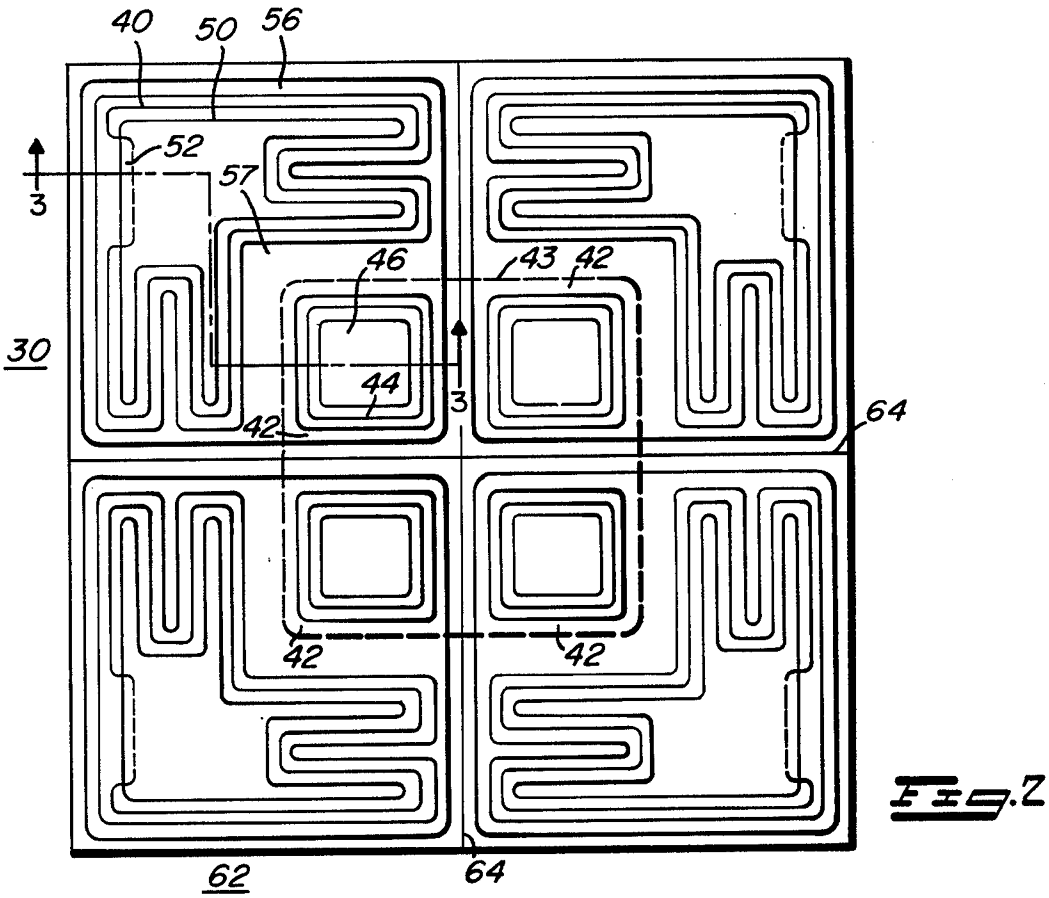
FIG. 2 is a top view of a four-chip group of single-diffused mesa type Darlington transistor circuits fabricated according to the invention.
Figure 3:
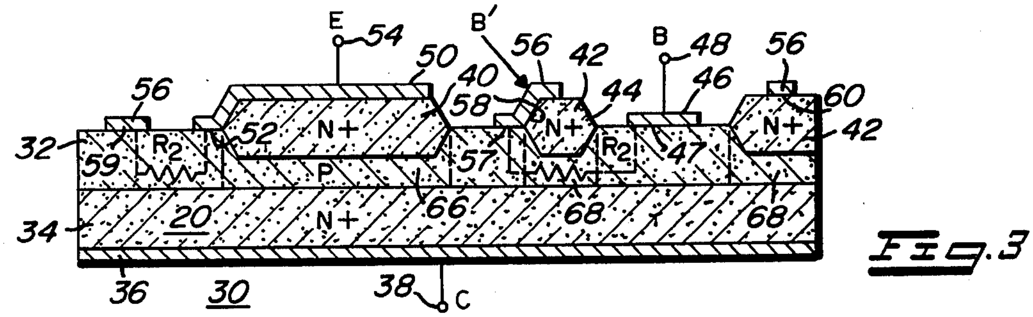
FIG. 3 is a sectional view of a single-diffused mesa type Darlington transistor die taken along line III—III of FIG. 2.

FIG. 2 is a diagram of a top view of an array of four identical single-diffused mesa type power Darlington chips symmetrically oriented about horizontal and vertical axes centered in the scribe grid areas so that the rectangular mesa type emitter regions, each having an essentially rectangular aperture therein of each input transistor are grouped together and form a single continuous mesa type region prior to scribing and separation of the four monolithic dice. Each of the four chip are rotated 90° with respect to the adjacent ones. FIG. 3 is a diagram of a cross section of a single-diffused mesa type Darlington circuit taken along section lines 3—3 of FIG. 2. Referring to FIG. 3, the monolithic Darlington circuit 30 includes a layer of P-type semiconductor material 32, which may be silicon. Layer 32 includes the base regions of both input transistor Q1 and output transistor Q2. A heavily doped N+ collector layer 34 on the lower surface of layer 32, provides a common collector region for transistor Q1 and Q2. Metal layer 36 contacts the lower surface of collector region 34, and is electrically connected to external collector terminal 38. An N+ mesa type region 40 forms the emitter region of the output transistor Q2, and a second N+ mesa region 42 forms the emitter of input transistor Q1. N+ emitter region 42 extends all the way to the edge of the semiconductor die and, prior to scribing, is continuous with the emitter mesas of the other three chips in the four-chip group. Emitter region 42 has an essentially rectangular opening 44 therein which exposes part of base layer 32. Base metal film 46, connected to external base input terminal 48, contacts P-type base layer 32. Emitter metal layer 50 contacts emitter region 40, and also extends over the edge of emitter region 40 and contacts base layer 32 at area 52. Emitter metal layer 50 is also electrically contacted to external emitter terminal 54. Metal layer 56, spaced from metal layer 50 and mesa type emitter region 40, contacts P-type base layer 32, and also overlies and contacts emitter region 42 at areas designated 58 and 60, respectively, in FIG. 3, thereby shorting the outside edge of the emitter region 42 to the adjacent area 57 of base layer 32. Emitter base resistor R1 (schematically depicted in the circuit in FIG. 1) is also schematically drawn in FIG. 3 and includes the distributed resistance of the P-type semiconductor material between area 57, contacted by metal layer 56, and area 47, contacted by metal layer 46. Metal layer 56 is designated B′ in FIG. 3 and is also designated in FIG. 1 as node B′. Emitter-base resistor R2 consists of the distributed resistance of the material of P-type base layer 32 between area 59, contacted by metal layer 56 and area 52, the point at which base layer 32 is contacted by emitter metal layer 50. Referring now to FIG. 2, the four chip array 62 includes four identical monolithic single-diffused mesa type power Darlington circuits prior to scribing and die separation, each rotated 90° with respect to the adjacent circuits. Referring to the Darlington circuit 30 in the upper left hand corner of the array 62, the top view clearly illustrates mesa type emitter region 40, which includes four "fingers" such as conventionally used in power transistors to increase emitter efficiency and high-current gain. A different number of fingers may, of course, be used. Mesa region 43 extends across scribe grid region 64 to form the emitter region 42 for each of the four monolithic dice. Opening 44 in mesa type emitter region 42 exposes a rectangular area of P-type base layer 32 to facilitate contact to the base electrode of each input transistor Q1 by a metal layer 46. Metal layer 50 contacts the surface of emitter region 40, and is spaced from the edge thereof to prevent emitter-base shorting everywhere except at area 52, where mesa type emitter region 40 is indented to facilitate contact to base layer 32 by metal layer 50, as depicted in both FIG. 2 and in FIG. 3. Metal layer 56 extends along the surface of P-type base layer 32, spaced from output emitter region 40, and runs onto input emitter region 42, thereby maintaining most of the surface of base layer 32 at a uniform potential, and also maintaining most of emitter region 42 surrounding opening 44 on Darlington circuit 30 at a uniform potential, as well as providing an emitter base short between the outside edge emitter region 42 and P-type base layer 32 at area 57 as previously described. The effective base region in P-type base layer 32 of output transistor Q2 is enclosed by dotted lines and is indicated in FIG. 3 by reference numeral 66, and the effective base region of input transistor Q1 is similarly indicated by reference numeral 68. Diode D (in FIG. 1) is formed by the P-type base layer 32 and the N-type collector region 34. It should be recognized that the current-carrying capability of the diode D is quite dependent on the area indicated in FIG. 2 by reference numeral 52.

Figure 4:
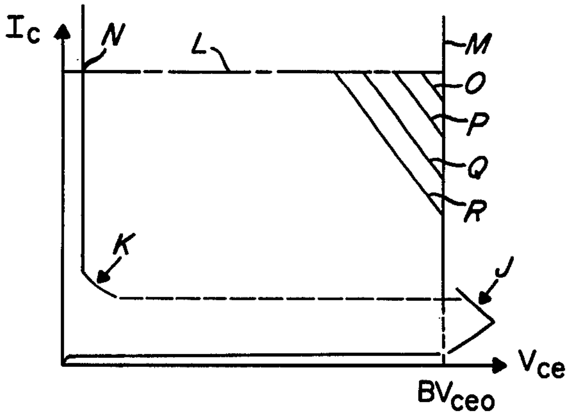
FIG. 4 is a diagram illustrating collector-emitter breakdown voltage, secondary breakdown and safe operating area for a power transistor or a Darlington circuit.

The single-diffused mesa type Darlington circuit as depicted in FIGS. 2 and 3 provides higher safe operating area (SOA) than any prior monolithic Darlington circuit. Safe operating area is a measure of the safe power dissipating capability of a transistor (or a Darlington circuit), and is explained herein with reference to the drawing in FIG. 4. The drawing in FIG. 4 illustrates two types of breakdown which may occur in a transistor (or Darlington circuit) on a graph having collector current $I_c$ on the vertical axis and collector-to-emitter voltage $V_{CE}$ on the horizontal axis. The vertical line designated by the letter M represents the current which will flow if the devices undergo breakdown when the base electrode is floating; this is a zero power dissipation condition. The voltage at which the breakdown occurs is designated $BV_{CEO}$. If the device is pulsed into a conducting state by a current pulse driven into its base electrode, the power dissipation will rise as the duty cycle of the current pulse waveform increases, and at some critical power dissipation (or duty cycle) the device goes into a second breakdown mode, called secondary breakdown. Secondary breakdown of a transistor is illustrated in FIG. 4 by the line indicated by the letters J, K and N, and is the phenomena which limits the power dissipating capability of the devices under discussion at high collector voltages, near $BV_{CEO}$.

As long as there is no base current into the transistor, that is as long as it is in the CEO mode, the transistor does not go into secondary breakdown, except at very high currents. Referring to FIG. 4, as the collector voltage is increased in the CEO mode, the collector current will increase along line M. However, if there is a sufficient amount of base current to trigger secondary breakdown, the collector voltage $V_{CE}$ will decrease along the line J-K-N as the collector current increases. Secondary breakdown may cause destruction of the device, and is therefore a limiting factor in determining the collector voltage and collector current limits for operating a transistor. Secondary breakdown is associated with both the collector-base junction and the emitter-base junction, and is controlled by the emitter-base junction. The electrical interplay of the junctions is such that secondary breakdown is triggered at lower magnitude collector voltages as the magnitude of the base drive is allowed to increase from zero. The phenomena is likely to occur at the sites of various material defects, such as dislocations, slippage in the lattice structure, etc. in the semiconductor material forming the base layer. During the emitter diffusion, diffusion spikes may occur at such sites. The exact mechanism of the secondary breakdown is not known, but seems to be associated with a connection of current through a small region, which heats up, causing still greater current flow (i.e., current "hogging" occurs), which eventually melts the material in the small region causing the emitter and collector to be shorted together, destroying the device.

The maximum collector current permitted by the device specification, $I_c$ (max), is also shown on FIG. 4, and is designated by the horizontal line L. As the duty cycle of the base current pulsing waveform is increased, a family of curves is also for convenience, plotted, on FIG. 4 which indicates the values of $I_c$ and $V_{CEO}$ at which the device goes into secondary breakdown. The family of curves is indicated by letters O, P, Q and R in order of increasing duty cycle. For a device, the area bounded by the lines L and a particular line such as O, P, etc. is defined as the safe operating area (SOA) of the device at the specific duty cycle. As seen from FIG. 4, the SOA decreases as duty cycle increases. Stated differently, the safe operating area is the area on the collector characteristic in which the transistor will operate efficiently without going into a secondary breakdown mode. As indicated previously, when secondary breakdown occurs, the collector-to-emitter voltage is substantially reduced. In fact, the reduction in breakdown voltage is drastic, and may, for example, drop from over 100 volts to less than 10 volts, resulting in destruction of the device if the current is not externally limited. The dotted line between the reference letters J and K in FIG. 4 indicates the abrupt nature of secondary breakdown. It should be recognized that there may be a family of secondary breakdown curves, such as curve J-K-N, each occurring at a different current level. The current level at which the onset of secondary breakdown occurs varies mainly with the amount of base current and the amount of power being dissipated by the chip and its temperature.

The phenomena of secondary breakdown is much more pronounced in epitaxial base devices, for example, than in single-diffused mesa type devices.

This is because single-diffused mesa-type devices normally have very deep emitter regions, which act as ballast resistance in series with the base. This tends to counteract the current hogging at sites of material defects by reducing the forward junction bias at regions where current hogging occurs.

Commonly required values of the emitter-base resistors R1 and R2, as indicated in FIGS. 1 and 3, are approximately 1000 ohms and 50 ohms, respectively. The structure and geometry of the monolithic Darlington circuit described herein permits such values of resistance to be obtained using a minimum amount of die area, particularly for R1. Referring to FIGS. 2 and 3, the total distributed resistance R1 has a cross sectional area which is proportional to the length of the boundary between mesa type emitter region 42 and area 57 of base layer 32 at which metal layer 56 shorts the periphery of emitter 42 to base layer 32. Since the distributed resistance contributing to R1 extends between contact area 47 and contact area 57 under, rather than around the deep emitter region 42, the cross sectional area of R1 is cut off since emitter region 42 extends to the edge of the die. If emitter region 42 did not extend to the edge of the die (as would be necessary if the wafer was to be diamond scribed) the value of R1 would be reduced by a large factor, since current would flow from contact area 47 outward in all directions, instead of only under two sides of the rectangular emitter region 42. The available methods of increasing R1 to an acceptable value (of approximately 1000 ohms) would then include reducing the cross sectional area of the distributed resistance thereof by reducing the size of metal layer 46, increasing the dimension of emitter region 42, and increasing the resistivity of the material base layer 32, increasing the depths of the emitter region 42. All of these alternatives require serious compromises in at least one of areas of lead bonding yield, die area, frequency response and gain. For these and other reasons, it has been unfeasible to manufacture a competitive monolithic single-diffused Darlington circuit prior to this invention. It should be apparent that the structure and method of manufacturing the monolithic single-diffused mesa type Darling circuit of this invention are closely related.

Figure 5:
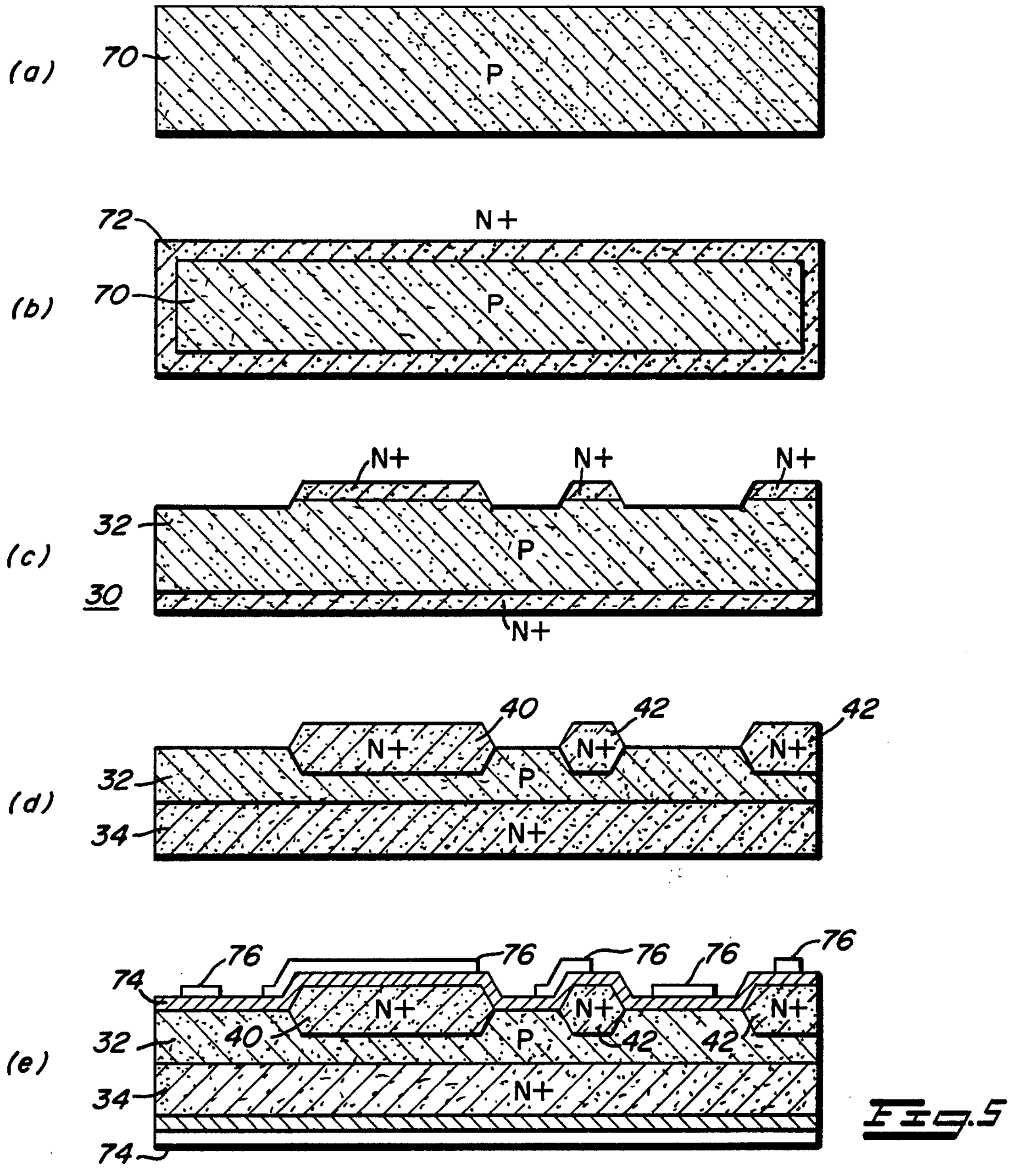
FIGS. 5*a–e* are a diagram illustrating the method of manufacturing a single-diffused mesa type Darlington device.

The manufacturing steps prior to the scribing and die separation operations are illustrated in FIGS. 5*a* to 5*e*. In FIG. 5*a*, a P-type wafer 70 is shown, which may have a thickness of approximately 7 to 7.5 mils and a resistivity which may vary from 5 to 70 ohms-centimeters, determined by the desired breakdown voltage. The entire wafer surface is cleaned and then an N+ predeposition diffusion region 72 is diffused into the entire surface of the wafer as shown in FIG. 5*b*. The thickness of the predeposition diffusion region 72 may be approximately 10 to 12 micons, and the doping concentration may be approximately $10^{22}$ atoms per cubic centimeter. The next step is to pattern the upper surface of the wafer using conventional photoresist and etching techniques to etch away portions of the N+ predeposition layer 72, thereby defining mesa type emitter regions for the plurlaity of dice fabricated on the wafer 70. FIG. 5*c* is a cross sectional view of a single die on the wafer after the step of etching to provide the individual mesa regions. The pattern illustrated in FIG. 5*c* is such that the cross section finally obtained will be that of Darlington circuit 30, shown in FIG. 3, and previously described herein. It should be noted that the predeposition concentration is very heavy because the emitters and the collector for the single-diffused devices under consideration should be driven in to provide a deep junction depth, of the order of approximately 3 mils. The deep junction depth is required to provide uniform current density and bias off high current density areas and hot sports which may develop during device operation. The base layer 32 for the single die 30 is part of the original P-type wafer 70. The next step in the manufacture of the single-diffused Darlington devices is to subject the wafer to a drive-in diffusion so that the N+ regions 40, 42 and 34 are driven in approximately 3 mils, thereby defining the base regions of transistor Q1 and Q2 (FIG. 1) to provide a base width which may be approximately 20 to 25 microns. The cross sectional view then appears as shown in FIG. 5*d*. A suitable metal layer 74 is applied to the upper and lower surfaces of the wafer as shown in FIG. 5*e*. The metal layer 74 may be formed by several process steps, including a first electroless nickel plating, which is sintered to provide good ohmic contact. A second electroless plating operation may be performed. A photoresist layer is then applied to the second nickel layer and then patterned to define the area where a leadtin solder-type metal layer 76 is subsequently applied. Removing the photoresist provides the structure shown in FIG. 5*e*. Subjecting the wafer to a suitable etchant to remove exposed part of layer 74 provides the structure shown in FIG. 3, wherein layer 50 in FIG. 3 includes both layers 74 and 76 of FIG. 5*e*.

The wafers are then laser scribed and the dice are then separated by conventional die separation techniques. However, the wafers may be sawed, rather than laser scribed, using, for example, abrasive sawing techniques. After die separation, the dice are subjected to a chemical etch to clean the emitter-base and collector-base PN junctions which terminate along the scribed edges of the dice. The purpose of the chemical etch is to eliminate electrical degradation of the junctions caused by scribing, separation and handling. Each individual die are attached to a header, and a protective coating of varnish is applied to protect all exposed PN junctions from subsequent contamination.

While the invention has been described in connection with several specific embodiments, it will be apparent to those skilled in the art that various changes in arrangement of parts may be made to suit various specific requirements. For example, PNP Darlington circuits are clearly within the scope of the invention.

What is claimed is:

1. A monolithic Darlington transistor circuit having an input transistor and an output transistor comprising:

a multi-sided body of semiconductor material of a first conductivity type forming the base regions of the input and output transistors of the Darlington transistor circuit, each of said sides being perpendicular to a major surface of said body of semiconductor material;

a diffused collector region of a second conductivity type in the lower surface of said body of said semiconductor material forming the collector regions of the input and output transistors;

a first mesa type diffused emitter in the upper surface of said body of semiconductor material forming the emitter of the input transistor and having therein an aperture exposing said body of semiconductor material wherein said first mesa type diffused emitter is located to extend to the edge of said multi-sided body at least at two adjacent sides thereof in the monolithic Darlington transistor circuit for reducing lateral active base-emitter area; and a second mesa type diffused emitter in the upper surface of said body of semiconductor material forming the emitter of the output transistor.

2. The monolithic Darlington transistor circuit as recited in claim 1 further including a first metal conductor contacting said body of semiconductor material within the aperture of said first mesa type diffused emitter, and spaced therefrom to avoid contacting said first mesa type diffused emitter, said first metal conductor being connected to a first terminal of the monolithic Darlington transistor circuit to provide base current to the base of the input transistor.

3. The monolithic Darlington transistor circuit as recited in claim 1 further including a second metal conductor contacting said first mesa type diffused emitter and said body of semiconductor material for establishing a uniform potential in said first mesa type diffused emitter and on the exposed surface of said body of semiconductor material, and for establishing a short circuit connection between the outside periphery of said first mesa type diffused emitter and the adjacent area of said body of semiconductor material.

4. The monolithic Darlington transistor circuit as recited in claim 3 further including a third metal conductor contacting said second mesa type diffused emitter and said body of semiconductor material for establishing a uniform potential in said second mesa type diffused emitter and for establishing a short circuit connection between said second mesa type diffused emitter and an area of said body of semiconductor material, said third metal conductor connected to a second terminal of said monolithic Darlington transistor circuit.

5. The monolithic Darlington transistor circuit as recited in claim 1 further including a fourth metal conductor contacting said diffused collector region, said fourth metal conductor also connected to a third terminal of said monolithic Darlington transistor circuit.

6. The monolithic Darlington transistor circuit as recited in claim 3 wherein the spacing between said first metal conductor and the area where said second metal conductor contacts said body of semiconductor material provides a predetermined resistance between the base and emitter of the input transistor.

7. The monolithic Darlington transistor circuit as recited in claim 4 wherein the spacing between the area where said third metal conductor contacts said body of semiconductor material and said second metal conductor provides a predetermined resistance between the base and emitter of the output transistor.

* * * * *